US 9,765,810 B2

(12) United States Patent
Miyake et al.

(10) Patent No.: US 9,765,810 B2
(45) Date of Patent: Sep. 19, 2017

(54) BALL JOINT AND METHOD FOR MANUFACTURING SAME

(71) Applicant: HONDA MOTOR CO., LTD., Tokyo (JP)

(72) Inventors: Koji Miyake, Kyoto (JP); Ryohei Nishiumi, Kyoto (JP); Kentaro Komori, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 14/784,559

(22) PCT Filed: Mar. 3, 2014

(86) PCT No.: PCT/JP2014/055280
§ 371 (c)(1),
(2) Date: Oct. 14, 2015

(87) PCT Pub. No.: WO2014/171199
PCT Pub. Date: Oct. 23, 2014

(65) Prior Publication Data
US 2016/0069383 A1    Mar. 10, 2016

(30) Foreign Application Priority Data

Apr. 18, 2013    (JP) ................................. 2013-087481

(51) Int. Cl.
*F16C 11/00*    (2006.01)
*F16C 11/06*    (2006.01)
(Continued)

(52) U.S. Cl.
CPC ...... *F16C 11/0604* (2013.01); *C23C 14/0605* (2013.01); *C23C 14/34* (2013.01);
(Continued)

(58) Field of Classification Search
CPC ........ F16H 37/043; F16H 3/089; F16H 63/30; F16H 2200/0034; F16H 2063/3093;
(Continued)

(56) References Cited

U.S. PATENT DOCUMENTS 6,499,881 B2 * 12/2002 Boutaghou ........ G11B 19/2009
                                                              384/107
6,994,474 B2 * 2/2006 Kinno ................. C23C 14/0605
                                                              384/492
(Continued)

FOREIGN PATENT DOCUMENTS

JP    8-004770 A      1/1996
JP    2000-042802 A   2/2000
(Continued)

OTHER PUBLICATIONS

International Search Report issued in PCT/JP2014/055280, mailed on Apr. 28, 2014.

*Primary Examiner* — Victor MacArthur
(74) *Attorney, Agent, or Firm* — Birch, Stewart, Kolasch & Birch, LLP

(57) ABSTRACT

Provided is a technique whereby a DLC film having a desired surface roughness and a desired film hardness can be easily formed within a short period of time while preventing cost increase so that a large quantity of boll joints, which are less expensive and yet have stable sliding characteristics, can be supplied. A method for manufacturing a ball joint provided with a ball stud that has a spherical surface section and a holder section that pivotally holds the spherical surface section, said method comprising: an intermediate underlayer-forming step for forming an intermediate underlayer, that has a fine irregular surface structure, on the surface of the spherical surface section using a sputtering method; and an amorphous hard carbon film-forming step for forming an amorphous hard carbon film, that has a root (Continued)

mean square roughness on the surface of 6.5-35 nm, on the intermediate underlayer using a PIG plasma film formation method.

5 Claims, 11 Drawing Sheets

(51) Int. Cl.
*C23C 16/26* (2006.01)
*C23C 16/50* (2006.01)
*C23C 14/06* (2006.01)
*C23C 14/34* (2006.01)

(52) U.S. Cl.
CPC .............. *C23C 16/26* (2013.01); *C23C 16/50* (2013.01); *F16C 11/0685* (2013.01); *F16C 2206/04* (2013.01); *F16C 2223/42* (2013.01); *F16C 2240/64* (2013.01)

(58) Field of Classification Search
CPC  F16C 2206/04; F16C 2240/54; F16C 33/043; F16C 33/16
See application file for complete search history.

(56) References Cited

U.S. PATENT DOCUMENTS

| | | | | |
|---|---|---|---|---|
| 7,172,343 | B2* | 2/2007 | Kinno | C23C 14/0605 384/492 |
| 7,461,978 | B2* | 12/2008 | Pope | A61F 2/30767 384/492 |
| 7,665,898 | B2* | 2/2010 | Pope | A61F 2/30767 384/492 |
| 8,734,913 | B2* | 5/2014 | Ando | C23C 16/042 427/569 |
| 9,318,141 | B2* | 4/2016 | Katano | G11B 5/725 |
| 2002/0057855 | A1* | 5/2002 | Boutaghou | G11B 19/2009 384/121 |
| 2003/0019106 | A1* | 1/2003 | Pope | A61L 27/04 29/898 |
| 2003/0099416 | A1* | 5/2003 | Kinno | C23C 14/0605 384/492 |
| 2004/0223676 | A1* | 11/2004 | Pope | A61F 2/30767 384/492 |
| 2005/0141797 | A1* | 6/2005 | Kinno | C23C 14/0605 384/492 |
| 2006/0205522 | A1* | 9/2006 | Ichikawa | F16D 3/2237 464/145 |
| 2007/0218266 | A1 | 9/2007 | Wort et al. | |
| 2009/0046967 | A1* | 2/2009 | Pope | A61F 2/30767 384/492 |
| 2010/0209665 | A1* | 8/2010 | Konovalov | B82Y 30/00 428/141 |
| 2010/0314005 | A1* | 12/2010 | Saito | C23C 8/26 148/318 |
| 2012/0034393 | A1* | 2/2012 | Ando | C23C 16/042 427/569 |
| 2012/0177915 | A1* | 7/2012 | Kasai | C10M 141/10 428/336 |
| 2013/0129264 | A1* | 5/2013 | Watanabe | C23C 16/27 384/13 |
| 2013/0220798 | A1* | 8/2013 | Ando | C23C 16/26 204/192.15 |
| 2013/0272776 | A1* | 10/2013 | Komori | F16C 11/0609 403/130 |
| 2014/0257494 | A1* | 9/2014 | Thorwarth | A61F 2/30 623/18.11 |

FOREIGN PATENT DOCUMENTS

| | | | | |
|---|---|---|---|---|
| JP | 2005-500489 A | | 1/2005 | |
| JP | 2008-163430 A | | 7/2008 | |
| JP | EP 2562289 A1 | * | 2/2013 | .............. C23C 16/26 |
| JP | EP 2657551 A1 | * | 10/2013 | .......... F16C 11/0609 |
| WO | WO 2012/086393 A1 | | 6/2012 | |

* cited by examiner

BALL JOINT AND METHOD FOR MANUFACTURING SAME

FIELD OF THE INVENTION

The present invention relates to: a ball joint for holding a ball stud having a spherical surface part in a freely rotatable manner; and a method for manufacturing the same.

BACKGROUND OF THE INVENTION

A ball joint can slide smoothly like a joint and change two joined members into arbitrary angles so as to transmit movement. Thus, such ball joints are used widely in the fields of auto parts, machine parts, controllers, and the like. Specifically, ball joints are applied to link mechanisms such as an arm, a tie rod, and a stabilizer in a suspension or a steering of an automobile or to movable parts of a transmission or the like.

In such ball joints, in recent years, for the purpose of further improvement in the wear resistance, the corrosion resistance, the sliding characteristics, and a friction behavior, an amorphous hard carbon film is formed on the surface of a ball stud spherical surface part serving as a substrate, as shown in FIG. 15.

This amorphous hard carbon film is generally referred to by various names such as diamond-like carbon (DLC), amorphous carbon, and diamond-form carbon (simply referred to as a "DLC film", in some cases hereinafter). Such amorphous hard carbon films have a high hardness, a wear resistance, a solid-state lubrication property, and an excellent chemical stability as well as smoothness, low counterpart aggressiveness, and a self-lubricity and hence can preferably be used as sliding materials.

As for the above-mentioned formation of an amorphous hard carbon film on the surface of a ball stud spherical surface part, for example, Patent Document 1 disclose a technique that a DLC film having a nano indentation hardness of 6 to 39 GPa and a surface roughness (a root mean square roughness) of 60 nm or smaller is formed on a ball joint surface so that a ball joint provided with a DLC film having a low counterpart aggressiveness, a high corrosion resistance, and a high wear resistance is formed and hence occurrence of stick slip can sufficiently be suppressed and sliding characteristics such as torque characteristics can stably be obtained.

PRIOR ART REFERENCES

Patent Documents

[Patent Document 1] International Publication No. 2012/086393

SUMMARY OF THE INVENTION

Problems to be Solved by the Invention

Nevertheless, in fabrication of the above-mentioned ball joints, the surface structure (especially, the surface roughness) and the film physical properties (especially, the film hardness) of the DLC film need appropriately be controlled. In the conventional art, such control has been performed by controlling the growth conditions of the DLC film during film formation of the DLC film on the substrate.

However, when such control of the surface roughness and control of the film hardness are to be performed simultaneously during the formation of the DLC film, the DLC film grows up in different characteristics depending on the raw material and the component. Thus, many parameters such as the pressure of the atmosphere, the film formation time, the applied bias, and the plasma intensity concerning the film formation need sophisticatedly be combined so that appropriate film formation conditions need be setup. Thus, this approach has not been easy.

Further, in general, the growth rate of a DLC film is not very high. Thus, there is a possibility that even when appropriate film formation conditions are set up, the film formation time becomes remarkably long depending on the conditions.

Thus, in place of the approach that both the surface roughness and the film hardness of the DLC film are to be preferably satisfied by controlling the growth conditions for the DLC film, an approach has been considered that control of the surface roughness is achieved by performing machining such as shot blast on the substrate surface and control of the film hardness is achieved by adjusting the film formation conditions for the DLC film.

That is, since the DLC film has a property of growing up with following (tracing) the surface roughness of the substrate during the growth, when the surface roughness of the substrate surface is appropriately controlled, the surface roughness of the DLC film can also be controlled. Thus, in a case that the DLC film is grown on such a substrate controlled into an appropriate surface roughness, film formation can be performed only with controlling the film hardness, that is, with taking into consideration only the parameters concerning the film hardness serving as the parameters concerning the film formation, and a DLC film satisfying both the surface roughness and the film hardness can eventually be obtained.

As such, when the control in the formation of the DLC film is divided into the control of the surface roughness and the control of the film hardness, a DLC film having a desired surface roughness and desired film hardness can easily be formed in a short time.

Nevertheless, this method has a problem that the employed machining unavoidably causes additional process steps and a cost increase, in addition to a problem that to control a desired micro region into fine surface properties is not easy.

Thus, a technique has been desired that a DLC film having a desired surface roughness and a desired film hardness can easily be formed in a short time without causing a cost increase and hence a large quantity of ball joints inexpensive and yet having stable sliding characteristics can be provided.

Means for Solving the Problem

As a result of intensive studies, the present inventors have found that the invention described in the following individual claims can solve the above-mentioned problems, and thus the present invention has been completed. The individual claims are sequentially described below.

The invention described in claim 1 is a method for producing a ball joint provided with a ball stud having a spherical surface part and with a holding part for holding the spherical surface part in a freely rotatable manner comprising:

an underlying intermediate layer formation step of forming an underlying intermediate layer having a micro surface depression and protrusion structure in a surface of the spherical surface part by using sputtering; and an amorphous hard carbon film formation step of forming on the underlying intermediate layer an amorphous hard carbon film whose surface has a root mean square roughness of 6.5 to 35 nm by using a PIG plasma film forming method.

In the course of study for solving the above-mentioned problems, the present inventors have thought that the above-mentioned problems could be solved when an intermediate layer provided with fine depressions and protrusions between the substrate surface and the DLC film is formed by using sputtering in place of machining such as shot blast and, after that, the DLC film is formed with the intermediate layer in between.

Then, as a result of various experiments, it has been recognized that in a case that before the formation of the DLC film, an underlying intermediate layer (simply referred to as an "intermediate layer", hereinafter) is formed on the surface of the spherical surface part of the ball stud serving as a substrate by using sputtering and, then, a DLC film is formed on the intermediate layer by using a PIG (Penning Ionization Gauge) plasma film forming method, a DLC film having a desired surface roughness and a desired film hardness can easily be formed in a short time without causing a cost increase.

That is, in the formation of the intermediate layer by using sputtering, film formation can be completed in a short time and, at the same time, when the surface roughness of the intermediate layer to be formed is controlled by using simple parameters such as the film formation time and the stacking thickness, an intermediate layer can easily be formed that is obtained by granular growth into fine depressions and protrusions so as to have a preferable surface roughness. Thus, surface treatment for the substrate can inexpensively be achieved in a short time, in comparison with machining such as shot blast.

Then, in a case that a DLC film is formed on the intermediate layer whose surface roughness has been controlled by performing granular growth into fine depressions and protrusions by using sputtering, as described above, since the DLC film grows up with tracing the surface roughness of the substrate, the surface roughness of the DLC film can preferably be controlled.

On the other hand, as described above, the film hardness of the DLC film can be controlled in accordance with few parameters such as the bias voltage and the pressure of the atmosphere which are easily controllable parameters.

As a result, a DLC film having a desired surface roughness and a desired film hardness can easily be formed in a short time without causing a cost increase and hence a ball joint inexpensive and yet having stable sliding characteristics can be provided.

Further, a cathode PIG type plasma CVD apparatus used in the film formation of the DLC film can be used also at the time that the intermediate layer is formed by sputtering. Thus, a ball joint can more efficiently be produced.

Further, in these experiments, the present inventors have found that when the root mean square roughness of the surface of the DLC film is 6.5 to 35 nm, a situation that the surface roughness becomes excessively high is avoided and hence a ball joint can be obtained in which the sliding characteristics can stably be maintained for a longer period of time than in the conventional art.

As described above, according to the invention of the present claim, a DLC film having a desired surface roughness and desired film hardness can easily be formed in a short time without causing a cost increase. Further, when the root mean square roughness of the surface of the DLC film is appropriately controlled into 6.5 to 35 nm, a ball joint can be produced and provided in which the sliding characteristics can stably be maintained for a longer period of time.

Further, since control of the surface roughness of the DLC film and control of the film hardness can independently be performed arbitrarily, a DLC film corresponding to desired characteristics can be formed and then a ball joint can be produced that has both a suppressed counterpart aggressiveness and a high sliding property. Thus, for example, a ball joint can be produced in which even in a high-temperature environment where intervention of lubricant is disadvantageous, adhesion of counterpart material is prevented and hence counterpart aggressiveness is suppressed.

Further, when the intermediate layer is formed by using sputtering, a sufficient adhesion force can be ensured in the interface between the DLC film and the intermediate layer and in the interface between the substrate and the intermediate layer by an anchor effect.

The invention described in claim 2 is
a ball joint comprising: a ball stud having a spherical surface part; and a holding part for holding the spherical surface part in a freely rotatable manner, wherein
an amorphous hard carbon film having a root mean square roughness of 6.5 to 35 nm is provided on the surface of the spherical surface part with an intermediate layer in between.

As described above, in the DLC film having a root mean square roughness of 6.5 to 35 nm, the surface roughness is not excessively high. Thus, the ball stud in which such a DLC film has been formed on the surface of the spherical surface part can be held in a freely rotatable manner with a sufficiently low friction coefficient by the holding part and can smoothly be rotated. As a result, occurrence of stick slip in the ball joint can sufficiently be suppressed and hence a ball joint can be provided that has excellent sliding characteristics with a low and stable torque (running torque).

Further, as described above, in the intermediate layer obtained by granular growth performed by using sputtering, an anchor effect is expressed so that a sufficient adhesion force can be ensured in the interface between the DLC film and the intermediate layer and in the interface between the substrate and the intermediate layer. Thus, a ball joint can be provided in which adhesion and durability are improved.

The invention described in claim 3 is
the ball joint according to claim 2, wherein the indentation hardness of the amorphous hard carbon film is 7.8 to 33 GPa.

When the hardness of the DLC film is excessively low, the amorphous hard carbon film itself is rapidly worn out. When the hardness is excessively high, the counterpart aggressiveness becomes high and hence the counterpart material is rapidly worn out. The preferable hardness is 7.8 to 33 GPa in the indentation hardness.

The invention described in claim 4 is
the ball joint according to claim 2 or 3, wherein the intermediate layer is any one of a metal layer or a semimetal layer, a nitride layer, and a carbide layer of an element selected from Ti, Cr, W, Si, and Ge.

When used as an intermediate layer, the metal layer or the semimetal layer, the nitride layer, and the carbide layer of such an element provide a sufficient adhesion force in the interface between the DLC film and the intermediate layer and in the interface between the substrate and the intermediate layer and hence are preferable.

The invention described in claim 5 is
the ball joint according to any one of claims 2 to 4, wherein the surface of the holding part in contact with the spherical surface part is provided with one or more kinds of a resin material selected from polyacetal resin, nylon resin, polyamide resin, polytetrafluoroethylene resin, polyether ether ketone ketone resin, elastomer resin, and a rubber material or of a composite material obtained by reinforcing the resin with filler or fiber.

These resins and their reinforced composite materials are excellent in the elasticity characteristics and the impact absorption property. Thus, the friction characteristics and the wear property between itself and the DLC film formed in the spherical surface part of the ball stud are maintained, and the spherical surface part of the ball stud can be held in a freely rotatable manner for a long period of time. Thus, such materials are preferable as a construction material for the counterpart material. Further, simultaneously, these materials are preferable from the perspective of capability of suppressing occurrence of unusual sound at the time of operation.

The invention described in claim 6 is the ball joint according to any one of claims 2 to 5, which is employed in auto parts.

The ball joint according to the present invention can be produced without causing a cost increase. Further, excellent sliding characteristics can stably be maintained for a long period of time. Thus, this ball joint is preferable especially as auto parts in which inexpensiveness and yet high quality reliability is required.

The invention described in claim 7 is a ball joint produced by the fabrication method for a ball joint according to claim 1.

When the above-mentioned fabrication method for a ball joint is employed, a large quantity of ball joints inexpensive and yet having stable sliding characteristics can be provided.

Effect of the Invention

According to the present invention, without the necessity of machining that causes a cost increase, a DLC film having a desired surface structure and desired film physical properties is efficiently formed in a short time. Therefore, a ball joint in which the sliding characteristics can stably be maintained for a long period of time, and a fabrication method thereof can be provided.

EMBODIMENTS OF IMPLEMENTING THE INVENTION

The present invention is described below in accordance with embodiments with reference to the drawings.

1. Ball Joint

Figure 1:
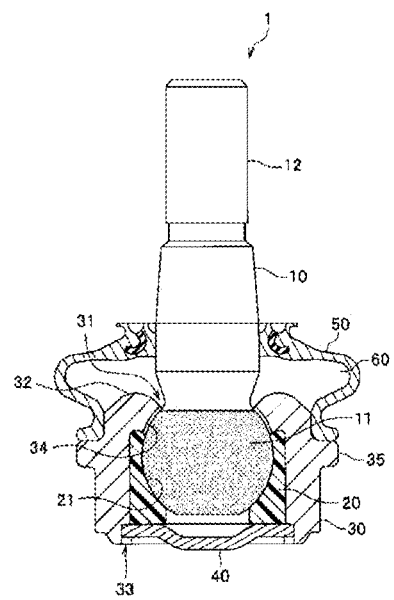
FIG. 1 is a longitudinal sectional view of a ball joint according to an embodiment of the present invention.

First, a ball joint according to the present embodiment is described below. FIG. 1 is a longitudinal sectional view of an example of a ball joint according to the present embodiment. The ball joint 1 includes: a ball stud 10 (construction material: steel) having a spherical surface part 11; and a seat 20 (construction material: resin) having a curved surface part 21. Then, they are assembled such that the spherical surface part 11 and the curved surface part 21 abut against each other so that the seat 20 serving as a holding part (a counterpart material) holds the spherical surface part 11 in a freely rotatable manner.

Here, in FIG. 1, numeral 12 indicates a shaft of the ball stud 10. Numeral 30 indicates a housing (construction material: steel) for containing the ball stud 10 and the seat 20. Numerals 31 and 33 indicate opening parts provided in the housing 30. Numeral 32 indicates a bent part formed in the vicinity of the opening part 31. Numeral 34 indicates a curved surface part provided in the housing 30 in correspondence to the spherical surface part 11. Further, numeral 35 indicates a flange arranged in the outer peripheral surface of the housing 30. Numeral 40 indicates a plug for closing the opening part 33 so as to fix the ball stud 10 and the seat 20. Numeral 50 indicates a boot (construction material: rubber). Here, the inside of the boot 50 is filled with grease 60.

In the ball joint 1 having the above-mentioned configuration according to the present embodiment, as the seat 20, a seat material formed from polyacetal resin or the like or a reinforced composite material thereof described above may suitably be selected and employed.

Figure 2:
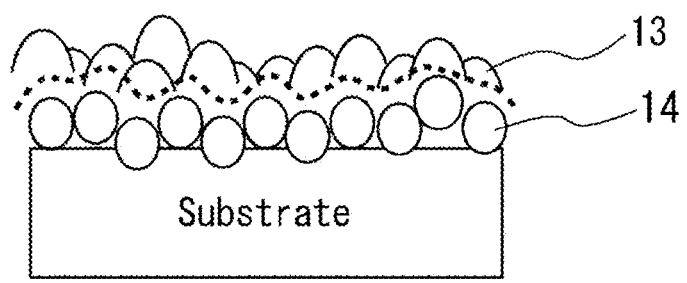
FIG. 2 is a sectional view schematically showing the structure of a spherical surface part surface of a ball stud of a ball joint according to an embodiment of the present invention.

Then, as shown in FIG. 2, a DLC film 13 having a root mean square roughness of 6.5 to 35 nm is formed on the surface of the spherical surface part 11 (a substrate) of the ball stud 10 in a manner that an intermediate layer 14 formed by using sputtering is located in between.

As the intermediate layer 14, as described above, a metal layer, a metal nitride layer, or a metal carbide layer of a metal selected from Ti, Cr, W, Si, and Ge is preferably employed. Further, two or more layers may be stacked together.

As for the thickness of the intermediate layer 14, when the thickness is excessively thin, granular growth does not sufficiently occur and hence an intermediate layer having a desired root mean square roughness cannot be formed. On the other hand, when the thickness is excessively thick, a possibility arises that breakage occurs in the inside and hence peeling occurs. A preferable film thickness is 0.1 to 2.0 µm.

The DLC film 13 is formed on the intermediate layer 14. Then, the root mean square roughness of the surface is controlled into 6.5 nm to 35 nm.

Then, the indentation hardness of the DLC film 13 is preferably 7.8 GPa to 33 GPa. By virtue of this, occurrence of stick slip can sufficiently be suppressed so that wear is reduced and the sliding characteristics can stably be maintained for a long period of time.

When the thickness of the DLC film 13 is excessively thin, a load acts and causes a possibility of disappearance in a short time. On the other hand, when the thickness is excessively thick, an internal stress increases and causes a possibility of occurrence of peeling. A preferable film thickness is 0.1 to 20 µm.

2. Fabrication Method for Ball Joint

Figure 3:
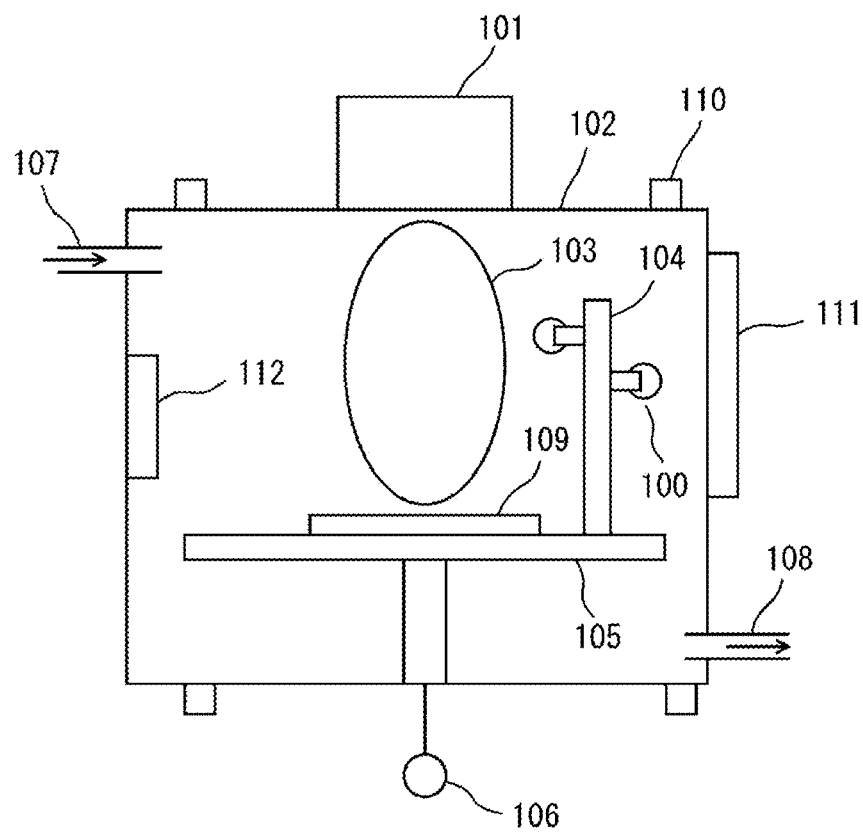
FIG. 3 is a schematic diagram of a cathode PIG type plasma CVD apparatus.

A ball joint having the above-mentioned configuration according to the present embodiment is produced by film formation of an intermediate layer and a DCL film onto the surface of the spherical surface part of a ball stud serving as a substrate by using a cathode PIG type plasma CVD apparatus shown in FIG. 3.

Here, in FIG. 3, numeral 100 indicates a ball joint. Numeral 101 indicates an electron gun. Numeral 102 indicates a reaction chamber. Numeral 103 indicates plasma formed in the reaction chamber. Numeral 104 indicates a jig for arranging the ball joint 100. Numeral 105 indicates a rotation and revolution mechanism for rotation and revolution of the jig 104 about the plasma 103. Numeral 106 indicates a bipolar pulse power supply. Numeral 107 indicates a gas introducing port. Numeral 108 indicates a gas discharge port. Numeral 109 indicates a reflection electrode. Numeral 110 indicates a coil. Numeral 111 indicates a magnetron sputtering target. Numeral 112 indicates a heater.

First, the jig 104 in which the ball joint 100 has been arranged is arranged in the rotation and revolution mechanism 105 in the reaction chamber 102. After that, vacuum evacuation of the inside of the reaction chamber 102 is performed and then a negative DC bias is applied on the magnetron sputtering target 111 arranged right opposite to the jig 104 so that an intermediate layer of target metal layer is formed on the surface of the ball joint 100.

At that time, the film formation conditions such as the film formation time and the film thickness are suitably adjusted such that the root mean square roughness of the surface of the DLC film to be obtained by film formation may become 6.5 to 35 nm. It is preferable that the adjustment is performed such that the root mean square roughness of the surface of the intermediate layer may become 3.0 to 35 nm.

After the completion of formation of the intermediate layer, plasma generation gas (such as Ar and $H_2$) is introduced through the gas introducing port 107 into the inside of the reaction chamber 102. Thermal electrons are generated from the electron gun 101 and then introduced into the reaction chamber 102 by a magnetic field formed by the coils 110 arranged up and down. At that time, since the reflection electrode 109 at a floating potential is arranged opposite to the electron gun 101 in the inside of the reaction chamber 102, the generated thermal electrons perform reciprocating oscillations in a space between the electron gun 101 and the reflection electrode 109 and thereby efficiently ionize the introduced gas so as to generate the high-density plasma 103.

Then, DLC raw material gas (such as $C_2H_2$, $CH_4$, $C_6H_{12}$, and tetramethylsilane (TMS)) is introduced through the gas introducing port 107 into the reaction chamber 102 so that a DLC film is formed on the intermediate layer. At that time, in order to avoid charge up caused by the DLC film (high resistance) obtained by film formation, a negative bias is applied by using the bipolar pulse power supply 106.

When the rotation and revolution mechanism 105 causes the jig 104 to perform rotation and revolution, the DLC film is uniformly formed over the entire surface of the ball joint 100 tracing the surface structure of the intermediate layer. At that time, the film hardness of the DLC film can be controlled by suitably adjusting the film formation conditions such as the bias voltage and the pressure of the atmosphere.

As such, in the fabrication method for a ball joint 1 according to the present embodiment, both the intermediate layer and the DLC film can be formed by using one cathode PIG type plasma CVD apparatus and the DLC film having a desired root mean square roughness and desired film hardness can be formed. Thus, without causing a cost increase, the ball joint can efficiently be produced in a short time. Then, in such a ball joint, as described above, the sliding characteristics can stably be maintained for a long period of time.

EXAMPLES

Next, the present invention is described in further detail in accordance with examples.

1. Experiments for Forming Intermediate Layer

Before the production of a ball joint, experiments for forming an intermediate layer were performed.

An intermediate layer made from Ti of Experiment Examples 1 to 4 was formed on the surface of a substrate composed of a steel material of chromium-molybdenum steel (SCM material) in the film formation conditions shown in Table 1 by sputtering by using the cathode PIG type plasma CVD apparatus having the above-mentioned configuration. Here, as a reference example, an intermediate layer made from Cr was formed as Experiment Example 5 (the film formation conditions were of standard conditions). The thickness of the intermediate layer formed in each experiment example is shown in Table 1.

Figure 4:
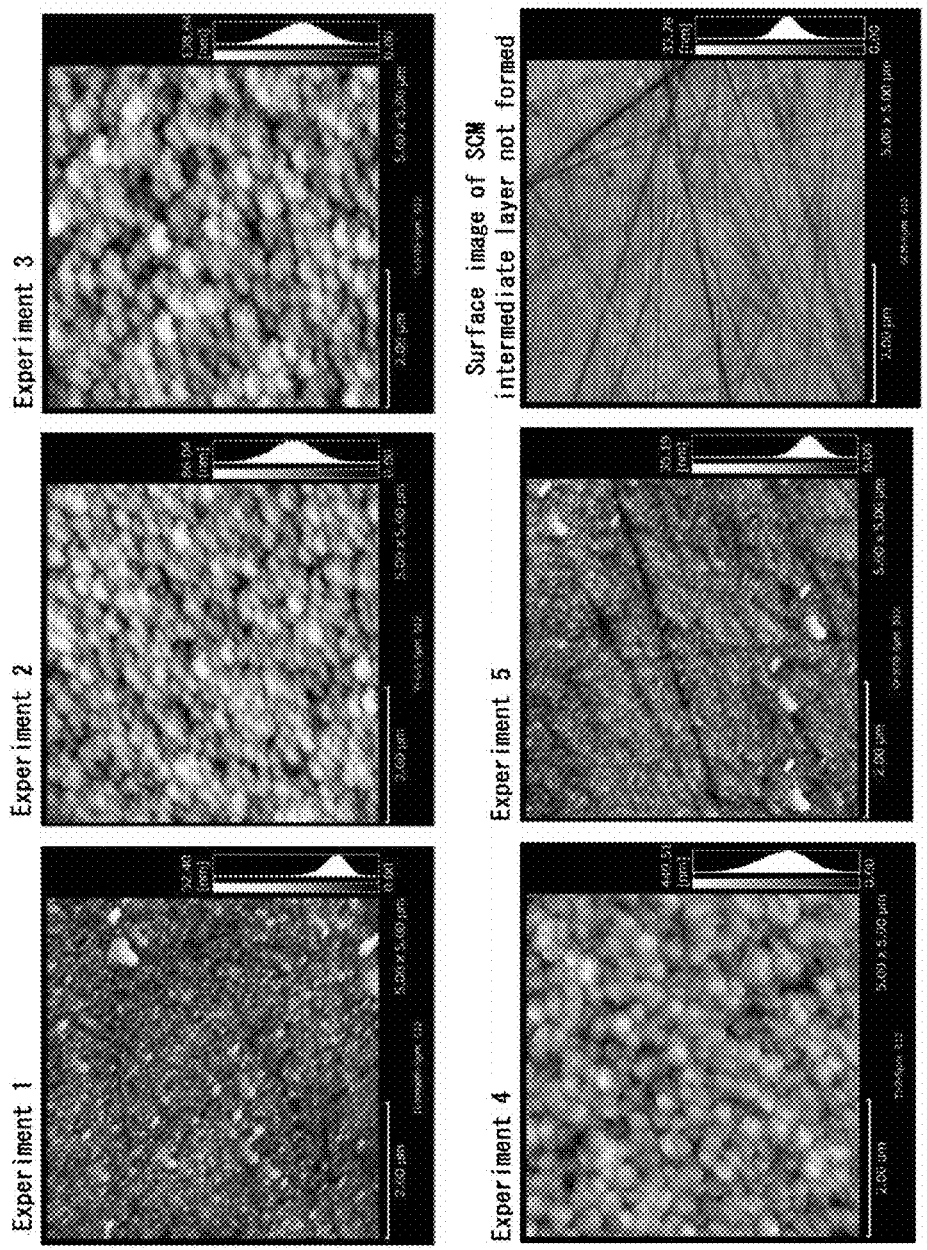
FIG. 4 shows AFM images of an intermediate layer surface and a substrate surface in Experiment examples 1 to 5.

Measurement was performed by using an atomic force microscope (AFM) on a region of a side length of 5×5 µm in the surface of each intermediate layer formed above. Then, from the measurement result, the average roughness Sa, the ten-point height Sz, the root mean square roughness Sq, the maximum peak height Sp, the maximum height Sy, and the surface area ratio were calculated in accordance with JIS B0601:2001. The results are shown in Table 1 and the AFM image of the surface of each intermediate layer is shown in FIG. 4. For comparison, FIG. 4 also shows a surface AFM image of an SCM material on which an intermediate layer is not formed.

TABLE 1

| Example | Interm. layer | Film form. conds. | Film thk. (μm) | Sa (nm) | Sz (nm) | Sq (nm) | Sp (nm) | Sy (nm) | Surf. Area Ratio. |
|---|---|---|---|---|---|---|---|---|---|
| Expt. 1 | Ti layer | Smooth. | 0.32 | 3.4 | 52.4 | 4.6 | 38.1 | 14.3 | 1.017 |
| Expt. 2 | | Std. | 0.27 | 9.3 | 86.1 | 11.7 | 41.5 | 44.6 | 1.034 |
| Expt. 3 | | Std. | 0.58 | 16.1 | 138.6 | 20.2 | 72.2 | 66.4 | 1.072 |
| Expt. 4 | | Std. | 1.30 | 52.3 | 449.6 | 65.5 | 241.8 | 207.9 | 1.599 |
| Expt. 5 | Cr layer | Std. | 0.22 | 2.2 | 35.2 | 3.0 | 24.6 | 10.6 | 1.008 |

From FIG. 4, it is recognized that when the intermediate layer was formed by using sputtering, regardless of the Ti layer or the Cr layer, granular growth has occurred appropriately so that fine depressions and protrusions have been formed in the substrate surface.

From Table 1, from comparison between the Ti layers, it is recognized that the surface roughness was larger and hence the surface area ratio was greater in the standard conditions than in the smoothing conditions or when the film thickness was thicker. Further, in comparison between the Ti layer and the Cr layer, it is recognized that granular growth has occurred more satisfactorily and hence a rougher surface has been formed in the Ti layer. From these results, it is recognized that the intermediate layer can be controlled into a desired micro surface roughness by suitably adjusting the construction material, the film formation conditions, and the film thickness of the intermediate layer into appropriate conditions.

2. Production of Ball Joint

On the basis of the above-mentioned experimental results, a Ti layer serving as an intermediate layer was formed on the surface of the spherical surface part composed of an SCM material having a diameter of 6 mm by sputtering using the cathode PIG type plasma CVD apparatus. After that, a DLC film was formed on the intermediate layer by using a plasma CVD method.

First, the ball joint 100 and the jig 104 were set up in the rotation and revolution mechanism 105, and then vacuum evacuation of the inside of the reaction chamber 102 was performed into $1.0 \times 10^{-3}$ Pa. After checking that vacuum evacuation into $1.0 \times 10^{-3}$ Pa or lower has been achieved, rotation and revolution of the jig 104 was performed, and then heating was performed at 200° C. for 30 minutes by the heater 112 so that moisture adhered to the reaction chamber 102, the ball joint 100 and the jig 104 was released. After that, vacuum evacuation of the inside of the reaction chamber 102 into $3.0 \times 10^{-3}$ Pa was performed.

Next, Ar and the $H_2$ gases were introduced through the gas introducing port 107 into the reaction chamber 102 at 20 ml/min and 50 ml/min, respectively and then the pressure in the reaction chamber 102 was adjusted into 0.2 Pa. After that, electric discharge was generated by the PIG at a discharge current of 5 A and a negative bias of 500 V was applied on the ball joint 100 for 20 minutes so that plasma cleaning was performed on the spherical surface part of the ball joint 100.

After the plasma cleaning, Ar gas alone was introduced at 20 ml/min and then the pressure in the reaction chamber 102 was adjusted into 0.5 Pa. Then, a DC bias of 400 to 500 V was applied on the magnetron sputtering target 111 composed of Ti so that an intermediate layer composed of Ti was formed on the surface of the spherical surface part of the ball joint 100 at a film thickness shown in Table 2. Here, the film thickness of the intermediate layer obtained by film formation was controlled by adjusting the sputtering time under the film formation conditions shown in Table 2.

After the intermediate layer film formation, individual gases of Ar, $C_2H_2$, and TMS were introduced into the reaction chamber 102 at 20 ml/min, 50 ml/min, and 30 ml/min, respectively and then the pressure in the reaction chamber 102 was adjusted into 0.5 Pa. After that, electric discharge was performed at a discharge current of 5 A and then a negative bias of 500 V was applied on the surface of the spherical surface part of the ball joint 100 so that film formation of a first Si—C layer was performed for 3 minutes.

Then, the discharge current was changed to 10 A, and further the introduction rates of $C_2H_2$ and TMS gases were changed into 100 ml/min and 15 ml/min, respectively. Then, film formation of a second Si—C layer was performed for 3 minutes.

After that, a DLC film was formed on the outermost surface into a film thickness shown in Table 2 according to the film formation conditions shown in Table 2. After the film formation, the inside of the reaction chamber 102 was sufficiently cooled down and then the ball stud in which the DLC film has been formed on the surface of the spherical surface part was taken out.

According to the above manner, a ball stud in which the intermediate layer and the DLC film on the surface of the spherical surface part have not been formed (Comparative example 1), ball studs in which the DLC film has been formed directly on the surface of the spherical surface part (Comparative examples 2 to 4), and ball studs in which the intermediate layer and the DLC film have been formed on the surface of the spherical surface part (Comparative example 5 and Examples 1 to 9) were produced.

In the description given above, formation of the DLC film was checked from a characteristic waveform obtained by Raman spectroscopy (a laser wavelength of 532 nm). Specifically, analysis was performed on the obtained waveform by correcting the base line and then performing curve fitting with a Gaussian function and a Lorentzian function so as to separating the waveform into a D-band having a peak in the vicinity of 1350 $cm^{-1}$ and a G-band having a peak in the vicinity of 1550 $cm^{-1}$. The peak height position of the G-band is denoted by a G-peak and the ratio of the peak height of the D-band to the peak height of the G-band is denoted by an ID/IG ratio. These values are shown in Table 3 as parameters of the Raman waveform used for estimating the carbon structure in the DLC film.

TABLE 2

| | Underlying interm. layer (Ti layer) | | DLC film | | | |
|---|---|---|---|---|---|---|
| Example | Film thick. (μm) | Film form. conds. | Film thick. (μm) | Gas | Gas pressure (Pa) | Substrate voltage (V) |
| Comp. 1 | — | — | — | — | — | — |
| Comp. 2 | — | — | 3.0 | $C_2H_2$ | 0.5 | 50 |

TABLE 2-continued

| Example | Underlying interm. layer (Ti layer) | | DLC film | | | |
|---|---|---|---|---|---|---|
| | Film thick. (μm) | Film form. conds. | Film thick. (μm) | Gas | Gas pressure (Pa) | Substrate voltage (V) |
| Comp. 3 | — | — | 3.0 | $C_2H_2$ | 0.5 | 200 |
| Comp. 4 | — | — | 3.0 | $CH_4$ | 0.5 | 300 |
| Comp. 5 | 1.0 | Std. | 3.0 | $C_2H_2$ | 0.5 | 500 |
| Exam. 1 | 0.25 | Smooth. | 3.0 | $C_2H_2$ | 0.5 | 500 |
| Exam. 2 | 0.25 | Std. | 3.0 | $C_2H_2$ | 0.5 | 50 |
| Exam. 3 | 0.25 | Std. | 3.0 | $CH_4$ | 0.5 | 200 |
| Exam. 4 | 0.25 | Std. | 3.0 | $CH_4$ | 0.5 | 250 |
| Exam. 5 | 0.25 | Std. | 3.0 | $CH_4$ | 0.5 | 500 |
| Exam. 6 | 0.5 | Std. | 3.0 | $C_2H_2$ | 0.5 | 500 |
| Exam. 7 | 0.5 | Std. | 3.0 | $CH_4$ | 0.5 | 250 |
| Exam. 8 | 0.5 | Std. | 3.0 | $C_6H_{12}$ | 0.5 | 500 |
| Exam. 9 | 0.5 | Std. | 3.0 | TMS/$C_2H_2$ | 0.5 | 500 |

3. Evaluation of Ball Joint (1) Surface Roughness

The surface roughness of the spherical surface part (the DLC film) in each of the Examples and the Comparative examples was measured by using an AFM (atomic force microscope) according to the similar manner as to mentioned above. Then, as representing values expressing micro surface properties of the DLC film surface, the root mean square roughness Sq (also referred to as an "AFM roughness", hereinafter) in a region of a side length of 20 μm was calculated and, at the same time, the surface area ratio was calculated. The results are shown in Table 3.

Figure 5:
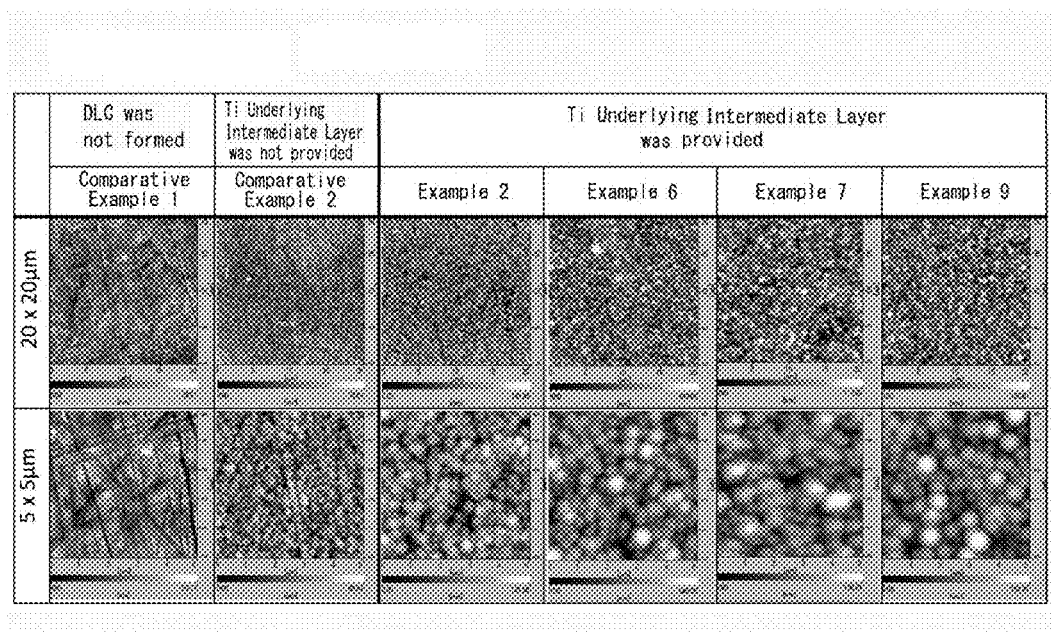
FIG. 5 shows AFM images of a spherical surface part surface of a ball stud of a ball joint of Examples of the present invention and Comparative examples.

FIG. 5 shows AFM images of Comparative examples 1 and 2, Examples 2, 6, 7, and 9. From FIG. 5, it is recognized that when the Ti layer was provided as an underlying intermediate layer, a granular structure in the DLC film surface has remarkably grown up. Here, as shown in Comparative example 2, even when the underlying intermediate layer was not provided, a fine granular structure was obtained as a result of the growth of the DLC film. Nevertheless, the growth was slow and hence the film formation conditions need have been combined sophisticatedly. Thus, this approach was not efficient.

Figure 6:
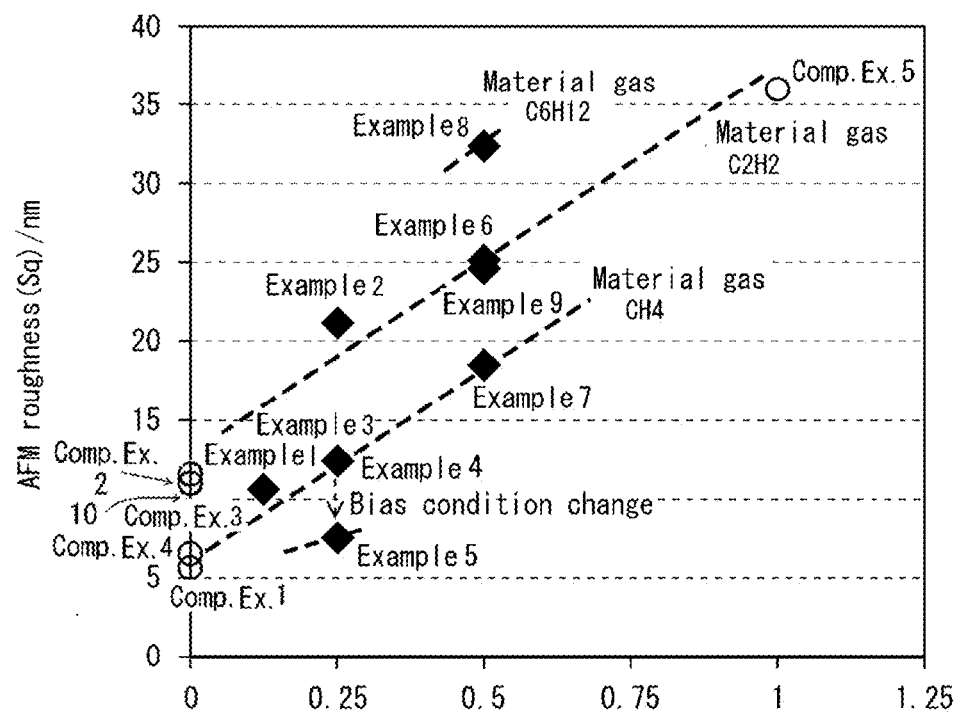
FIG. 6 is a diagram showing a relation between the AFM roughness of the surface of the DLC film and Ti layer stacking conditions.

FIG. 6 shows the relation between the film thickness of the Ti layer and the AFM roughness of the surface of the DLC film shown in Table 3. From FIG. 6, it is recognized that when the material gas is the same, the film thickness of the Ti layer and the AFM roughness of the surface of the DLC film are in a linear correlation with each other. Hence the surface roughness of the DLC film can be controlled by adjusting the thickness of the Ti layer.

(2) Film Characteristics

The hardness and Young's modulus of the spherical surface part (the DLC film) in each of the Examples and the Comparative examples was measured by a nano indentation method according to ISO 14577. The results are shown in Table 3.

(3) Measurement of Parts Torque (Running Torque)

Grease was applied to the ball stud produced in each of the Examples and the Comparative examples. After that, the ball stud together with the seat made of polyacetal resin was assembled into the housing so that a tie-rod end ball joint for linking a suspension to a steering gear box in an automobile was produced (five pieces each). Then, the parts torque (the running torque) under an ordinary temperature environment was measured.

Figure 7:
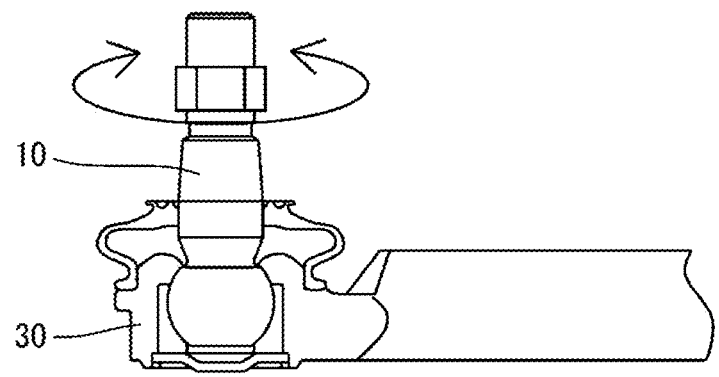
FIG. 7 is a diagram describing a measurement method for the running torque.

Specifically, as shown in FIG. 7, the housing 30 was fixed and a torque wrench was attached to the ball stud 10 and then the ball stud 10 was rotated at 5 deg/s so that the running torque was measured. The average of measured values in each of the Examples and the Comparative examples was calculated. Further, the difference between the maximum and the minimum relative to the average was adopted as a variation. Then its relative value obtained by normalization that the variation in Comparative example 1 was adopted as 1 was calculated as a variation ratio. The results are shown in Table 3.

Figure 8:
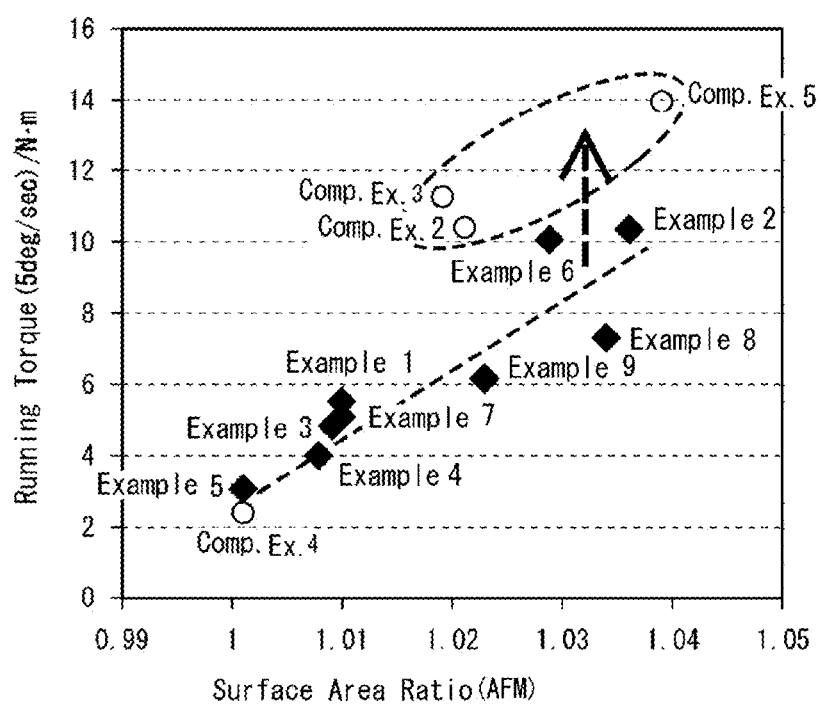
FIG. 8 is a diagram showing a relation between the running torque and the surface area ratio of a spherical surface part of a ball stud.

FIG. 8 shows the relation between the running torque and the surface area ratio. From FIG. 8, it is recognized that in Examples 1 to 9 where the Ti layer was provided, the running torque has increased linearly with increasing surface area ratio. This indicates that when the surface area ratio is appropriately controlled, a desired running torque can be obtained. In contrast, in the Comparative examples where Ti was not provided, it is recognized that even when the surface area ratio was comparable, the running torque has extremely increased. This indicates that control is not easy.

Figure 9:
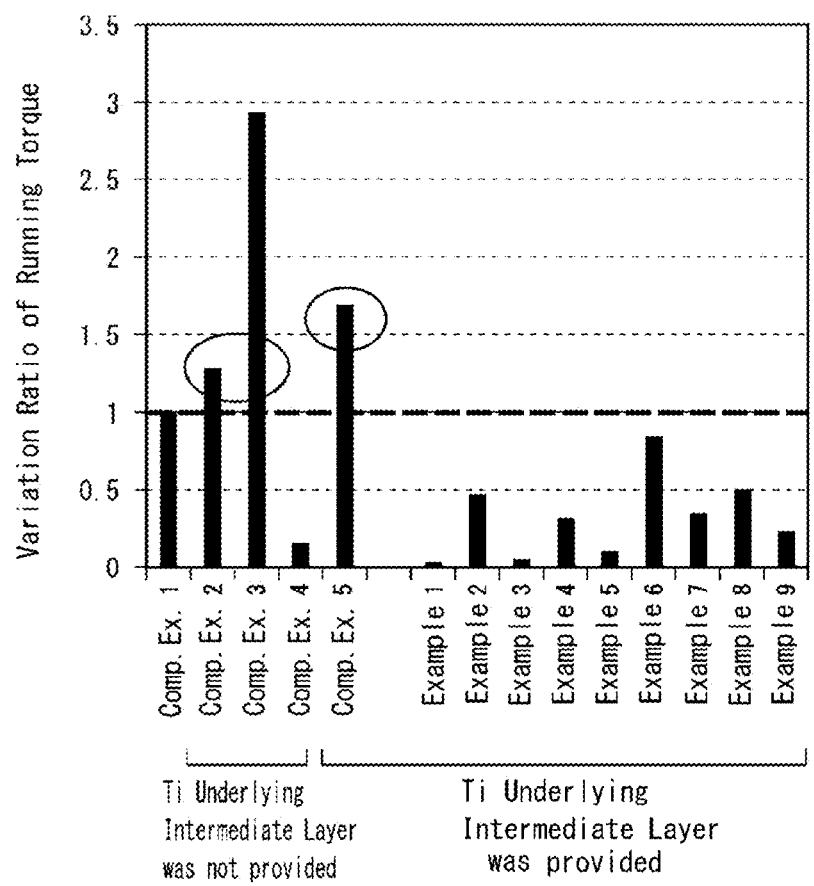
FIG. 9 is a diagram showing a variation rate of the running torque of Examples 1 to 9 and Comparative examples 1 to 5.

FIG. 9 shows the variation ratio of the running torque in each of the Examples and the Comparative examples. From FIG. 9, it is recognized that when the Ti layer was not provided (In Comparative examples 2 and 3), the variation ratio of the running torque has remarkably become large as indicated in a circled portion on the left side and that, on the other hand, when the Ti layer was provided (Examples 1 to 9), the variation in the running torque has been improved into a low value and hence stable expression of the sliding characteristics can be achieved. Further, when the Ti layer condition was excessive (In Comparative example 5), it is recognized that as indicated in a circled portion on the right side, the DLC film surface has become excessively rough so that the torque value has remarkably increased and hence the variation ratio of the running torque also has become large.

Further, in comparison between Example 2 and Comparative example 2, despite that a relatively soft DLC film was formed in both cases, a low variation in the running torque and stable sliding characteristics were obtained in Example 2 only. This indicates that in a case that the Ti layer has been provided, even when a relatively soft DLC film is provided, stable sliding characteristics are obtained and hence flexibility in the selection of a DLC film increases with respect to the hardness.

(4) Wear Test

Figure 10:
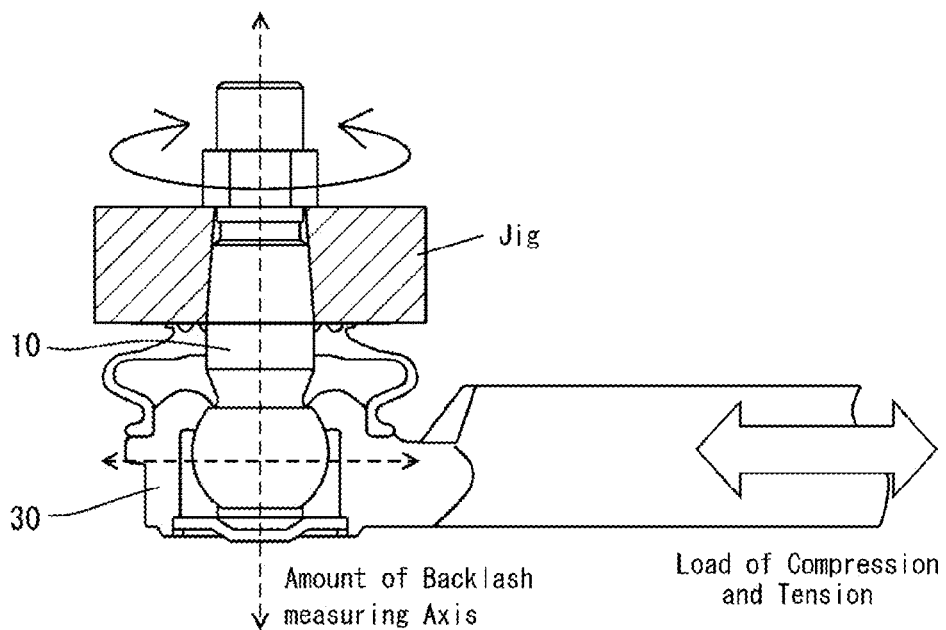
FIG. 10 is a diagram describing a test method of a wear test.

As shown in FIG. 10, load operation that in a state that the ball stud 10 was fixed to a fixture, the ball stud 10 was revolved with repeating compression and tension with a weight load of 2.5 to 5.6 kN, and this was repeated 100,000 times. After that, compression load was vertically and horizontally applied on the ball stud 10, and the amount of backlash was measured. The amount of backlash may be regarded as an indicator of aggressiveness to the counterpart material. A relative value obtained by normalization that the amount of backlash in Comparative example 1 was adopted as 1 was calculated as a wear ratio. Table 3 shows these results together with the results of observation of the presence or absence of damage in the DLC film after the wear test.

Figure 11:
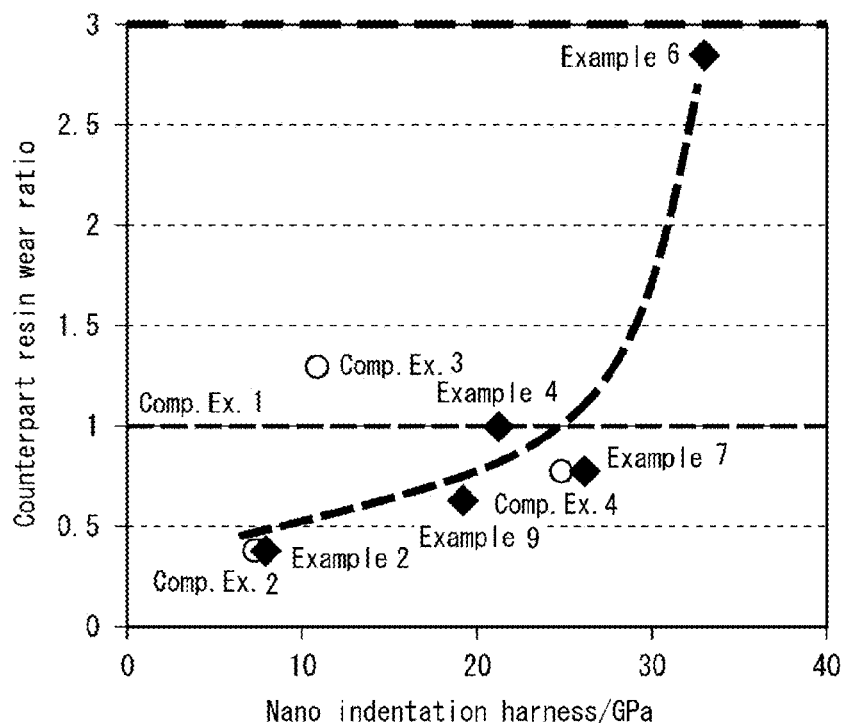
FIG. 11 is a diagram showing a relation between the counterpart resin wear ratio in a wear test and the nano indentation hardness of a spherical surface part surface.

FIG. 11 shows the relation between the nano indentation hardness and the counterpart resin wear ratio. From FIG. 11, it is recognized that the wear ratio gradually increases with increasing hardness of the DLC film, and the wear ratio starts to remarkably increase in the vicinity of the point of approximately 30 GPa.

Although depending on the usage conditions or the like, in general, when the wear ratio exceeds 3 times that of Comparative example 1, the amount of backlash becomes large and hence a possibility is caused that the functionality is degraded owing to a delay in the operation, occurrence of unusual sound, and the like. Thus, as recognized from FIG. 11, it is preferable to adjust the hardness of the DLC film as to be maintained at 33 GPa or lower.

Figure 12:
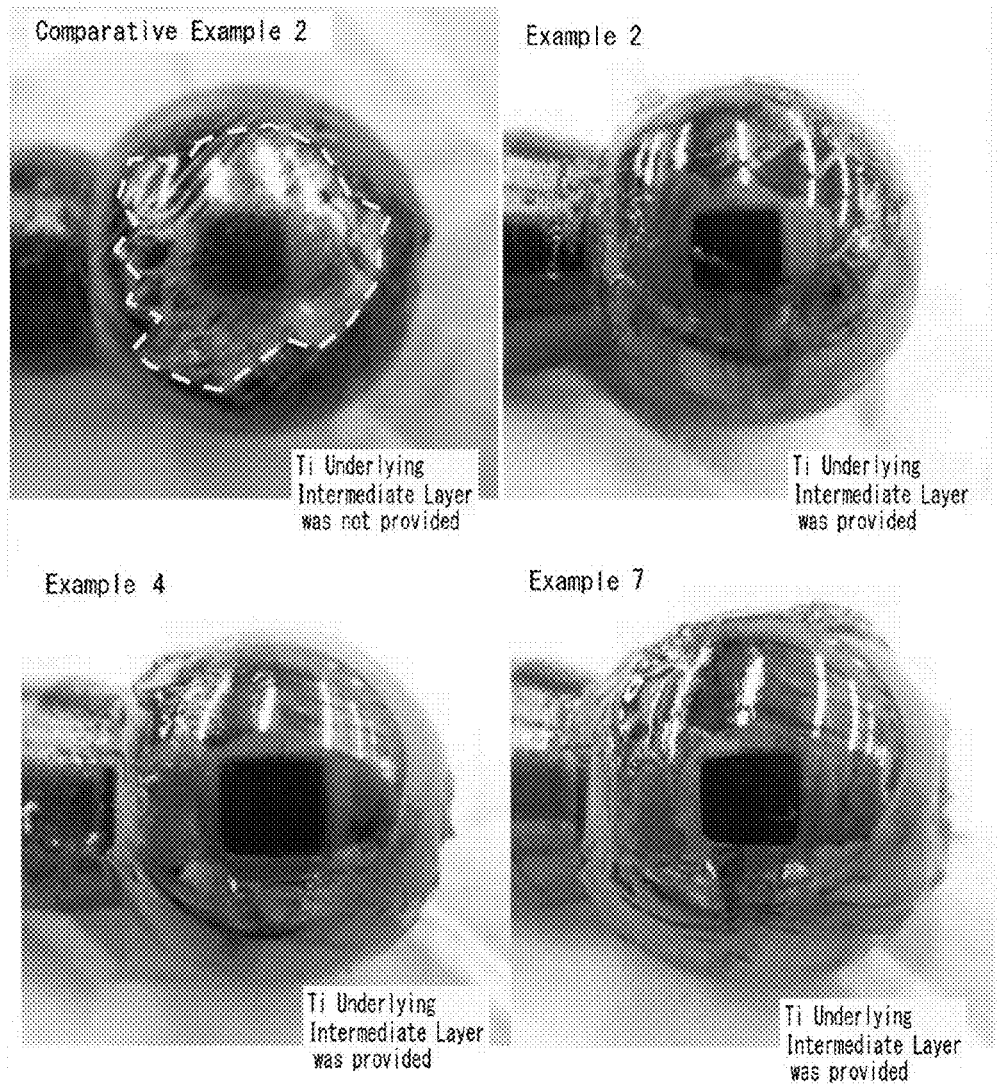
FIG. 12 is photographs of a spherical surface part of a ball stud after a wear test.

FIG. 12 shows photographs of the spherical surface part in Comparative example 2, Example 2, 4, and 7 taken after the wear test. From FIG. 12, it is recognized that in all of the Examples, the degree of wear and peeling is lower than in Comparative example 2. For example, even in Example 2 where a relatively soft DLC film was formed similarly to Comparative example 2, remarkable wear was not found.

It is recognized that in Examples 4 and 7, the degree of wear and peeling is lower than in Example 2, and that when the hardness of the DLC film is set to be 7.8 GPa or higher, wear and peeling of the DLC film can preferably be prevented.

the Ti layer thickness and the DLC film formation conditions, the surface roughness of the DLC film can efficiently be controlled with accuracy.

Figure 14:
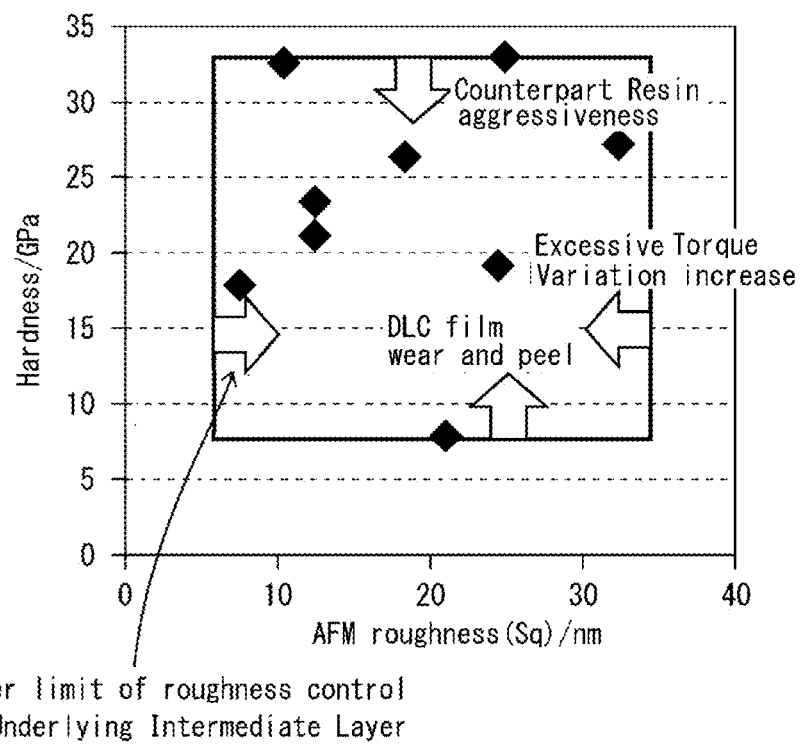
FIG. 14 is a diagram showing a relation between the AFM roughness of a DLC film and the hardness of a ball stud of Examples 1 to 9.
Figure 15:
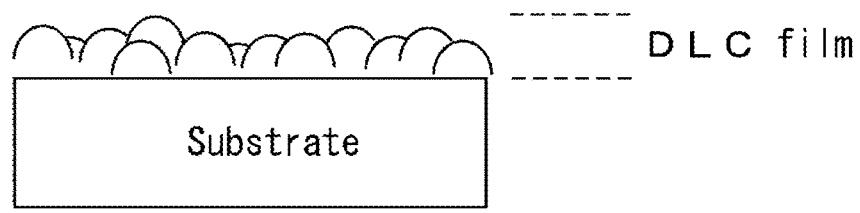
FIG. 15 is a sectional view schematically showing the structure of a spherical surface part surface of a ball stud of a conventional ball joint.

FIG. 14 shows the relation between the AFM roughness and the hardness measured in the DLC film of Examples 1 to 9, which are given in Table 3. As recognized from FIG. 14, it is preferable to control the AFM roughness Sq of the DLC film into a range between 6.5 nm which is the lower limit of the roughness control by the underlying intermediate layer and 35 nm where the torque becomes excessive so that a variation increase is caused. Further, it is recognized to be preferable to control the hardness of the DLC film into a range between 7.8 GPa where wear or peeling does not occur in the DLC film and 33 GPa where counterpart resin aggressiveness becomes large. Then, it is recognized that the control of the surface roughness and the hardness into the above-mentioned numerical ranges can be achieved when the DLC film is formed on an underlying intermediate layer having been formed into an appropriate surface roughness.

The present invention was illustrated based on the above embodiments. The present invention is not limited to the

TABLE 3

| | DLC film | | | | | | Ball joint | | | |
|---|---|---|---|---|---|---|---|---|---|---|
| | | Raman | | Surface properties (AFM) | Nano indent. | | Compo-part torque | | Wear test | |
| Ex. | Film thk. (μm) | G-peak (cm$^{-1}$) | ID/IG | Sq (20 μm) (nm) | Surf. Modu. | Hard (GPa) | Young Modu. | deg/s (N·m) | Var. rat. | Wear rat. | DLC film damg. |
| Comp 1 | — | — | — | 5.6 | 1.004 | 4.1 | 218 | 1.5 | 1 | 1.00 | |
| Comp 2 | 3.0 | 1526 | 0.35 | 12 | 1.021 | 7.3 | 55 | 10.3 | 1.28 | 0.38 | Wear peel |
| Comp 3 | 3.0 | 1529 | 0.44 | 11 | 1.019 | 11 | 87 | 11.2 | 2.93 | 1.31 | None |
| Comp 4 | 3.0 | 1543 | 0.43 | 6.4 | 1.001 | 25 | 184 | 2.4 | 0.15 | 0.77 | None |
| Comp 5 | 3.0 | 1548 | 0.55 | 36 | 1.039 | 28 | 260 | 13.9 | 1.69 | | |
| Exam. 1 | 3.0 | 1553 | 0.71 | 10 | 1.01 | 33 | 278 | 5.5 | 0.03 | | |
| Exam. 2 | 3.0 | 1523 | 0.36 | 21 | 1.036 | 7.8 | 57 | 10.3 | 0.45 | 0.38 | None |
| Exam. 3 | 3.0 | 1534 | 0.4 | 12 | 1.009 | 23 | 171 | 4.8 | 0.05 | | |
| Exam. 4 | 3.0 | 1532 | 0.46 | 13 | 1.008 | 21 | 160 | 4.0 | 0.31 | 1.00 | None |
| Exam. 5 | 3.0 | 1554 | 0.68 | 7.5 | 1.001 | 18 | 133 | 3.0 | 0.1 | | |
| Exam. 6 | 3.0 | 1552 | 0.53 | 25 | 1.029 | 33 | 271 | 10 | 0.84 | 2.85 | None |
| Exam. 7 | 3.0 | 1535 | 0.42 | 18 | 1.01 | 26 | 200 | 5.1 | 0.35 | 0.77 | None |
| Exam. 8 | 3.0 | 1553 | 0.57 | 32 | 1.034 | 27 | 226 | 7.3 | 0.5 | | |
| Exam. 9 | 3.0 | 1476 | 0.15 | 25 | 1.023 | 19 | 164 | 6.2 | 0.23 | 0.62 | None |

(5) High-Temperature Wear Test

Figure 13:
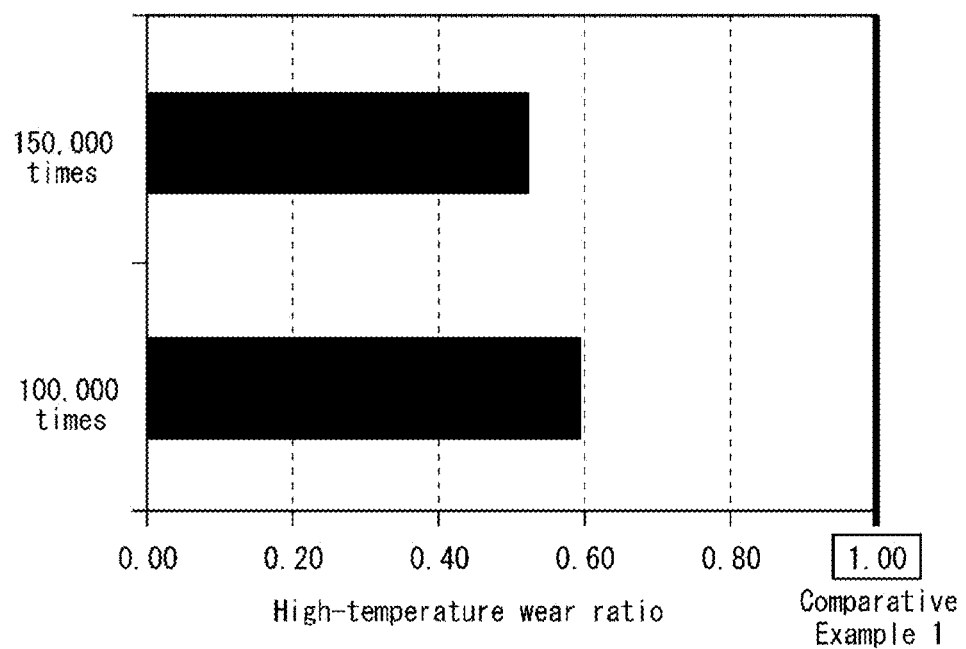
FIG. 13 is a diagram showing a test result of a high-temperature wear test of a ball stud of Example 4.

Next, as for Comparative example 1 and Example 4, according to the similar manner as to mentioned above, a high-temperature wear test was performed wherein the environmental temperature was set to be 90° C. and the number of times of load was set to be 100,000 times and 150,000 times, respectively. The results are shown in FIG. 13. From FIG. 13, it is recognized that the high-temperature wear ratio in Example 4 was reduced to as low as approximately half of that in Comparative example 1. The reason of this is expected that even when the viscosity of grease goes low in the high-temperature environment so that intervention of the lubricant becomes disadvantageous, the DLC film having been formed prevents adhesion between of the seat (the counterpart material) and the spherical surface part.

From comprehensive consideration of the results of the above-mentioned tests, from Tables 2 and 3, it is recognized that when the conditions such as the material gas kind, the gas pressure, and the substrate voltage in the DLC film formation are suitably adjusted, the surface roughness of the DLC film varies. Hence, it is recognized that, by combining embodiments. The embodiments can be variously changed in the range which is the same as or equivalent to the present invention.

DESCRIPTION OF THE REFERENCE SIGNS

1 Ball Joint
10 Ball Stud
11 Spherical Surface Part
12 Shaft
13 DLC Film
14 Intermediate Layer
20 Seat
21 34 Curved Surface Part
30 Housing
31 33 Opening Part
32 Bent Part
35 Flange
40 Plug
50 Boot
60 Grease
100 Ball Joint 101 Electron Gun
102 Reaction Chamber
103 Plasma
104 Jig
105 Rotation and Revolution Mechanism
106 Bipolar Pulse Power Supply
107 Gas Introducing Port
108 Gas Discharge Port
109 Reflection Electrode
110 Coil
111 Magnetron Sputtering Target
112 Heater

What is claimed is:

1. A method for producing a ball joint provided with a ball stud having a spherical surface part and with a holding part for holding the spherical surface part in a freely rotatable manner comprising:
an underlying intermediate layer formation step of forming an underlying intermediate layer having a micro surface depression and protrusion structure having a root mean square roughness of 3.0 to 35 nm in a surface of the spherical surface part by using sputtering; and
an amorphous hard carbon film formation step of forming on the underlying intermediate layer an amorphous hard carbon film whose surface has a root mean square roughness of 6.5 to 35 nm by using a PIG plasma film forming method
wherein, in the above-mentioned amorphous hard carbon film formation step,
surface roughness of the above-mentioned amorphous hard carbon film is controlled by growing the amorphous hard carbon film with tracing the micro surface depression and protrusion structure of the underlying intermediate layer, and
hardness of the above-mentioned amorphous hard carbon film is controlled by controlling parameters of film formation conditions.

2. A method for producing a ball joint provided with a ball stud having a spherical surface part and with a holding part for holding the spherical surface part in a freely rotatable manner comprising:
forming an underlying intermediate layer having a micro surface depression and protrusion structure having a micro surface depression and protrusion structure having a root mean square roughness of 3.0 to 35 nm in a surface of the spherical surface part by using sputtering; and
forming an amorphous hard carbon film on the underlying intermediate layer, said amorphous hard carbon film having a surface with a root mean square roughness of 6.5 to 35 nm by using a PIG plasma film forming method;
wherein, in the above-mentioned amorphous hard carbon film formation step,
controlling the surface roughness of the amorphous hard carbon film by growing the amorphous hard carbon film with tracing the micro surface depression and protrusion structure of the underlying intermediate layer, and
hardness of the amorphous hard carbon film is controlled by controlling bias voltage and a pressure of the atmosphere.

3. The method for producing a ball joint according to claim 2, wherein indentation hardness of the amorphous hard carbon film is 7.8 to 33 GPa.

4. The method of producing a ball joint according to claim 2, wherein the intermediate layer is any one of a metal layer or a semimetal layer, a nitride layer, and a carbide layer of an element selected from Ti, Cr, W, Si, and Ge.

5. The method of producing a ball joint according to claim 2, wherein the surface of the holding part in contact with the spherical surface part is provided with one or more kinds of a resin material selected from polyacetal resin, nylon resin, polyamide resin, polytetrafluoroethylene resin, polyether ether ketone ketone resin, elastomer resin, and a rubber material or of a composite material obtained by reinforcing the resin with filler or fiber.

* * * * *